United States Patent
Hsiao et al.

(10) Patent No.: US 9,554,478 B2
(45) Date of Patent: Jan. 24, 2017

(54) FRAME AND DISPLAY DEVICE USING SAME

(71) Applicant: SHENZHEN CHINA STAR OPTOELECTRONICS TECHNOLOGY CO., LTD., Shenzhen, Guangdong (CN)

(72) Inventors: Yuchun Hsiao, Guangdong (CN); Chong Huang, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/008,395

(22) PCT Filed: Jun. 29, 2013

(86) PCT No.: PCT/CN2013/078524
§ 371 (c)(1),
(2) Date: Sep. 27, 2013

(87) PCT Pub. No.: WO2014/180064
PCT Pub. Date: Nov. 13, 2014

(65) Prior Publication Data
US 2016/0066449 A1    Mar. 3, 2016

(30) Foreign Application Priority Data
May 10, 2013    (CN) .......................... 2013 1 0173576

(51) Int. Cl.
*G06F 1/16*     (2006.01)
*H05K 5/00*    (2006.01)
(Continued)

(52) U.S. Cl.
CPC ............. *H05K 5/0217* (2013.01); *A47B 81/06* (2013.01); *G02F 1/133308* (2013.01);
(Continued)

(58) Field of Classification Search
CPC ............................ G06F 1/1601; G06F 1/1637
(Continued)

(56) References Cited

U.S. PATENT DOCUMENTS 6,507,484 B2 *   1/2003   Fukuyoshi ........ G02F 1/133308
                                                                345/156
2008/0266484 A1 * 10/2008   Teng ................. G02F 1/133608
                                                                349/58

FOREIGN PATENT DOCUMENTS

CN          2393131 Y      8/2000
CN          1525236 A      9/2004
(Continued)

OTHER PUBLICATIONS

Zhang YiLiang, the International Searching Authority written comments, Feb. 2014, CN.

*Primary Examiner* — Anthony Haughton

(57) ABSTRACT

The present invention discloses a frame for holding a display panel. The frame includes a number of side frames and at least one rotating part. The side frames are connected end to end to form an enclosed frame for accommodating the display panel. The side frame defines at least one cutout extending along a longitudinal direction of the side frame. The rotating part is received in the cutout and is rotatably connected to the side frame via a rotating axis extending along the longitudinal direction of the side frame. The display panel is assembled in the enclosed frame via the rotating part. The present invention further provides a display device having the frame.

11 Claims, 5 Drawing Sheets

(51) Int. Cl.
    *H05K 7/00*     (2006.01)
    *H05K 5/02*     (2006.01)
    *H04N 5/64*     (2006.01)
    *G02F 1/1333*     (2006.01)
    *A47B 81/06*     (2006.01)

(52) U.S. Cl.
    CPC ............ *G06F 1/1601* (2013.01); *H04N 5/64* (2013.01); *H05K 5/0017* (2013.01); *G02F 2001/133317* (2013.01); *G02F 2001/133322* (2013.01)

(58) Field of Classification Search
    USPC .................... 361/679.21, 679.22; 349/56–60
    See application file for complete search history.

(56) References Cited

FOREIGN PATENT DOCUMENTS

| CN | 102867461 A | 1/2013 |
| CN | 103003858 A | 3/2013 |

\* cited by examiner

FRAME AND DISPLAY DEVICE USING SAME

TECHNICAL FIELD OF THE INVENTION

The invention relates to frames and display devices using the frames, and particularly, to a frame used to hold and position a display panel.

BACKGROUND OF THE INVENTION

A frame used in a current display device for holding a display panel usually reserves a gap between a peripheral wall of the frame and a periphery of the display panel. However, a size of the reserved gap is difficult to determine. If the reserved gap is too large, the display panel assembled in the frame is easy to move and the frame fails to satisfy a slim design demands. If the reserved gap is too small, the display panel is difficult to be assembled in the frame.

Therefore, a frame can solve the above-mentioned problem needs to be provided.

SUMMARY OF THE INVENTION

To solve the above-mentioned problem, an embodiment of the present invention provides a frame for holding a display panel. The frame includes a number of side frames and at least one rotating part. The side frames are connected end to end to form an enclosed frame for accommodating the display panel. The side frame defines at least one cutout extending along a longitudinal direction of the side frame. The rotating part is received in the cutout and is rotatably connected to the side frame via a rotating axis extending along the longitudinal direction of the side frame. The display panel is assembled in the enclosed frame via the rotating part.

Wherein, the side frame includes a holding board and a first side wall. The holding board includes a first surface and a second surface parallel arranged along a thickness direction thereof. The holding boards on the different side frame are connected end to end to form an enclosed frame with a central opening. The first side wall extends along the longitudinal direction of the side frame from a position on the first surface closing to an outer periphery of the first surface. The first side wall and the holding board cooperatively define a first receiving space to receive the display panel.

Wherein, the frame further includes a second side wall extending along the longitudinal direction of the side frame from a position on the second surface closing to an outer periphery of the second surface. The second side wall and the holding board cooperatively define a second receiving space.

Wherein, the cutout includes a first part defined in the first side wall and a second part defined in the holding board at a position corresponding to the first part. The first part completely cuts off the first side wall. The second part is extended along a width direction of the holding board, but do not cuts off the holding board.

Wherein, the rotating part includes a wall part corresponding to the first side wall and a holding part corresponding to the holding board. The wall part is connected to the holding part at a periphery extending along a longitudinal direction of the wall part. The wall part is received in the first part of the cutout. The holding part is received in the second part of the cutout. An outer side of the periphery at which the wall part is connected to the holding part is connected to a portion of the second side wall located in the cutout. A thickness of a connecting portion between the second side wall and the rotating part is distinctly less than a thickness of the second side wall.

Wherein, the cutout includes a third part defined in the first side wall. The rotating part includes an elongated circular roller and a rotating axis passing through the roller along a rotational symmetry axis of the roller. Two opposite ends of the rotating axis along a longitudinal direction of the rotating axis are correspondingly connected to two opposite end surfaces of the cutout to assembly the roller in the cutout, and make the roller to rotate around the rotating axis extending along the longitudinal direction of the side frame.

Wherein, the cutouts are extended along the longitudinal direction of the side frame. A length of the cutout is less than a length of each side frame.

Wherein, the number of the cutouts is two or more than two. The cutouts are symmetrical about a center of the enclosed frame.

Correspondingly, the present invention further provides a display device. The display device includes a frame and a display panel held in the frame. The frame includes a number of side frames and at least one rotating part. The side frames are connected end to end to form an enclosed frame for accommodating the display panel. The side frame defines at least one cutout extending along a longitudinal direction of the side frame. The rotating part is received in the cutout and is rotatably connected to the side frame via a rotating axis extending along the longitudinal direction of the side frame. The display panel is assembled in the enclosed frame via the rotating part.

Wherein, the display panel is selected from a group consisting of a liquid crystal display panel and an organic light emitting diode display panel.

Wherein, the side frame includes a holding board and a first side wall. The holding board includes a first surface and a second surface parallel arranged along a thickness direction thereof. The holding boards on the different side frame are connected end to end to form an enclosed frame with a central opening. The first side wall extends along the longitudinal direction of the side frame from a position on the first surface closing to an outer periphery of the first surface. The first side wall and the holding board cooperatively define a first receiving space to receive the display panel.

Wherein, the frame further includes a second side wall extending along the longitudinal direction of the side frame from a position on the second surface closing to an outer periphery of the second surface. The second side wall and the holding board cooperatively define a second receiving space.

Wherein, the cutout includes a first part defined in the first side wall and a second part defined in the holding board at a position corresponding to the first part. The first part completely cuts off the first side wall. The second part is extended along a width direction of the holding board, but do not cuts off the holding board.

Wherein, the rotating part includes a wall part corresponding to the first side wall and a holding part corresponding to the holding board. The wall part is connected to the holding part at a periphery extending along a longitudinal direction of the wall part. The wall part is received in the first part of the cutout. The holding part is received in the second part of the cutout. An outer side of the periphery at which the wall part is connected to the holding part is connected to a portion of the second side wall located in the cutout. A thickness of a connecting portion between the second side wall and the rotating part is distinctly less than a thickness of the second side wall.

Wherein, the cutout includes a third part defined in the first side wall. The rotating part includes an elongated circular roller and a rotating axis passing through the roller along a rotational symmetry axis of the roller. Two opposite ends of the rotating axis along a longitudinal direction of the rotating axis are correspondingly connected to two opposite end surfaces of the cutout to assembly the roller in the cutout, and make the roller to rotate around the rotating axis extending along the longitudinal direction of the side frame.

Wherein, the cutouts are extended along the longitudinal direction of the side frame. A length of the cutout is less than a length of each side frame.

Wherein, the number of the cutouts is two or more than two. The cutouts are symmetrical about a center of the enclosed frame.

The frame and the display panel using the frame provided in the present invention set a rotating part in the side frames of the frame to guide the display panel in the frame, which make the display panel is easy to be assembled in the frame even though the reserved gap between a periphery of the frame and the display panel is very small.

BRIEF DESCRIPTION OF THE DRAWINGS

In order to illustrate technical schemes of the present invention or the prior art more clearly, the following section briefly introduces drawings used to describe the embodiments and prior art. Obviously, the drawing in the following descriptions just is some embodiments of the present invention. The ordinary person in the related art can acquire the other drawings according to these drawings without offering creative effort.

DETAILED DESCRIPTION OF THE PREFERRED EMBODIMENTS

The following sections offer a clear, complete description of the present invention in combination with the embodiments and accompanying drawings. Obviously, the embodiments described herein are only a part of, but not all of the embodiments of the present invention. In view of the embodiments described herein, any other embodiment obtained by the person skilled in the field without offering creative effort is included in a scope claimed by the present invention.

Figure 1:
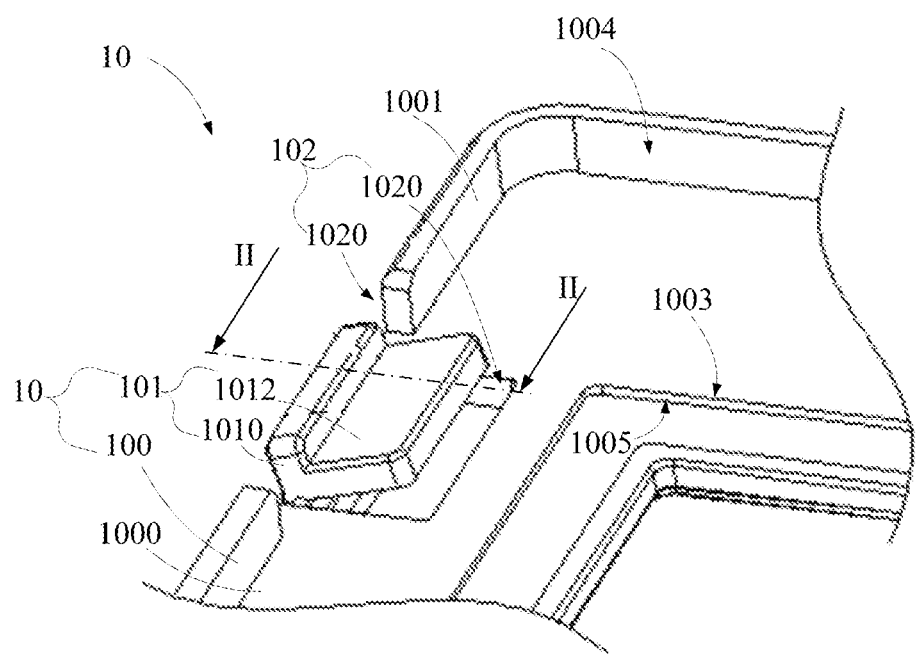
FIG. 1 is a schematic structural view of a frame in accordance with a first embodiment of the present invention, the frame includes a number of side frames and a rotating part set on the side frames.
Figure 2:
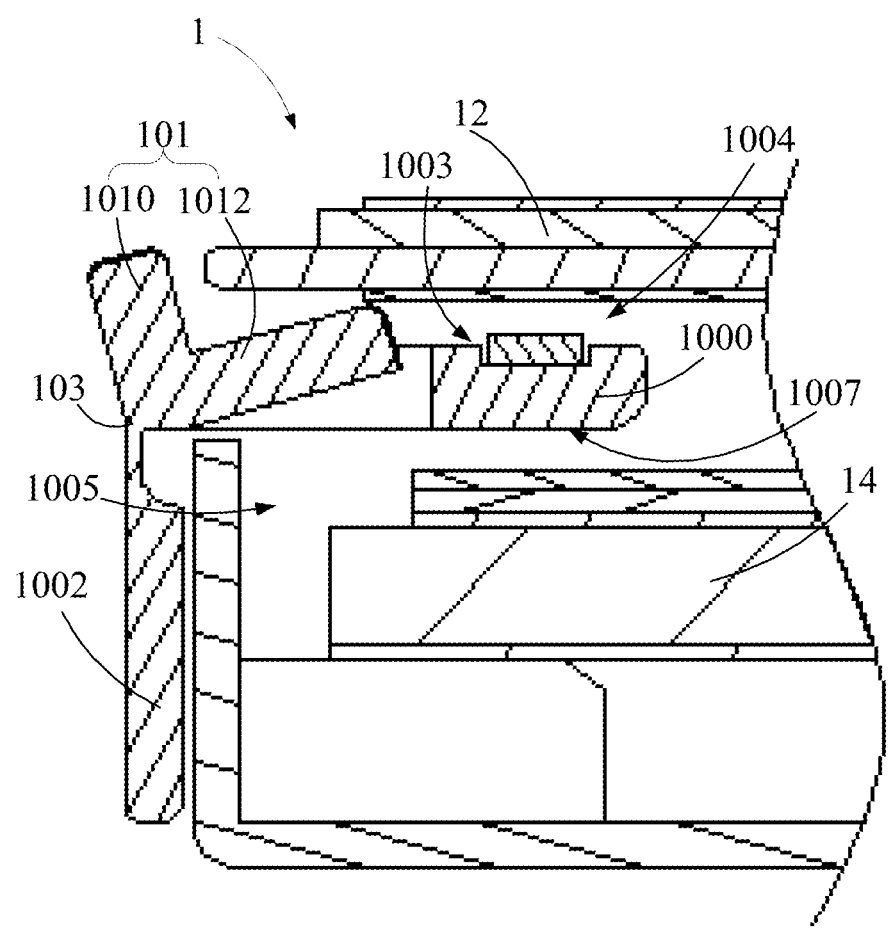
FIG. 2 is a cutaway view of FIG. 1 along II-II line, to illustrate the rotating part rotates away from the side frame to guide a display panel.

Referring to FIGS. 1 and 2, a first embodiment of the present invention provides a display device 1. The display device 1 includes a frame 10, a display panel 12 held in the frame 10, and a backlight module 14. The frame 10 includes a number of side frames 100 and at least one rotating part 101. The side frames 100 are connected end to end to form an enclosed frame for accommodating the display panel 12. The side frame 100 defines at least one cutout 102 extending along a longitudinal direction of the side frame 100. The rotating part 101 is received in the cutout 102 and is rotatably connected to the side frame 100 via a rotating axis 103 extending along the longitudinal direction of the side frame 100. The display panel 12 is assembled in the enclosed frame via the rotating part 101. In this embodiment, the frame 10 includes four side frames 100. The four side frames are connected end to end to form a rectangular receiving frame. The display panel may be, but is not limited to, a liquid crystal display panel.

The side frame 100 includes a holding board 1000, a first side wall 1001, and a second side wall 1002. The holding board 1000 includes a first surface 1003 and a second surface 1007 parallel arranged along a thickness direction thereof. The holding boards on the different side frame are connected end to end to form an enclosed frame with a central opening. The first side wall 1001 extends along the longitudinal direction of the side frame 100 from a position on the first surface 1003 closing to an outer periphery of the first surface 1003. The second side wall 1002 extends along the longitudinal direction of the side frame 100 from a position on the second surface 1007 closing to an outer periphery of the second surface 1007. The first side wall 1001 and the holding board 1000 cooperatively define a first receiving space 1004 to receive the display panel 12. The second side wall 1002 and the holding board 1000 cooperatively define a second receiving space 1005 to receive the backlight module 14. A light from the backlight module 14 is emitted to the display panel 12 via the central opening of the enclose frame for providing a backlight of the display panel 12.

It is understood that, in the other alternative embodiments, the display panel is a self-illuminating panel. For example, an organic light emitting diode display panel. The display device 1 do not needs the backlight module 14. The second side wall 1002 can be omitted.

The cutouts 102 are defined at an outer periphery of the side frame 100. The cutouts 102 are extended along the longitudinal direction of the side frame 100. A length of the cutout 102 is less than a length of each side frame 100. Preferably, the number of the cutouts 102 is two or more than two. The cutouts 102 are symmetrical about a center of the enclosed frame with a benefit of a stress balance on the display panel 12 during an assembly. In this embodiment, the cutout 102 is in a shape of "L", and includes a first part 1020 defined in the first side wall 1001 and a second part 1022 defined in the holding board at a position corresponding to the first part 1020. The first part 1020 completely cut off the first side wall 1001. The second part 1022 is extended along a width direction of the holding board 1000, but do not cuts off the holding board 1000.

The rotating part 101 is received in the cutout 102, and is rotatably connected to the side frame 100 around a rotating axis 103 extending along a longitudinal direction of side frame 100. In this embodiment, the rotating part 102 is an "L" shaped body corresponding to the "L" shaped cutout 102. The rotating part 102 includes a wall part 1010 corresponding to the first side wall 1001 and a holding part 1012 corresponding to the holding board 1000. The wall part 1010 is connected to the holding part 1012 at a periphery extending along a longitudinal direction of the wall part 100. An outer side of the periphery at which the wall part 1010 is connected to the holding part 1012 is connected to a portion of the second side wall 1002 located in the cutout 102. A thickness of a connecting portion between the second side wall 1002 and the rotating part 101 is distinctly less than a thickness of the second side wall 1002, in order to make the rotating part 101 rotate around the periphery connecting with the second side wall 1002. The rotating part 101 is integrated formed with the second side wall 1002.

Figure 3:
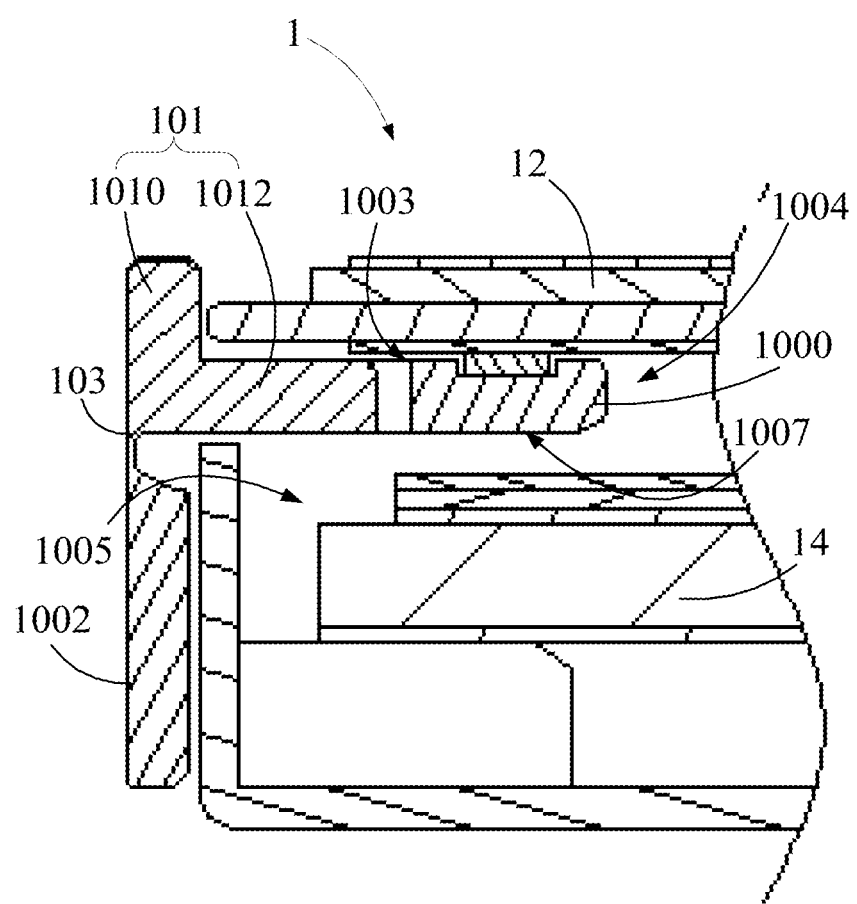
FIG. 3, similarly to FIG. 2, is a cutaway view to illustrate the rotating part rotates back to the side frame to position the display panel.

Referring to FIGS. 2 and 3, when the display panel 12 is assembled, even though a reserved gap between a periphery of the display panel 12 and the second side wall 1002 is very small, the rotating part 101 can be rotated out of the cutout 102. Thus, a gap between the periphery of the display panel 12 and the wall part 1010 becomes large, is easy to put the display panel 12 on the holding part 1012, and to rotate the rotating part 101 back in the cutout 102 to make the display panel 12 is assembled in the first receiving space 1004. After being assembled, a gap between the periphery of the display panel 12 and the first side wall 1001 is very small, which avoids the display panel 12 from moving in the first receiving space 1004. When the display panel 12 needs to be disassembled, to rotate the rotating part 101 out of the cutout 102 for pushing the display panel 12 out of the first receiving space 1004, at the same time, the gap between a periphery of the display panel 12 and the wall part 1010 become large, and is easy to take out the display panel 12.

Figure 4:
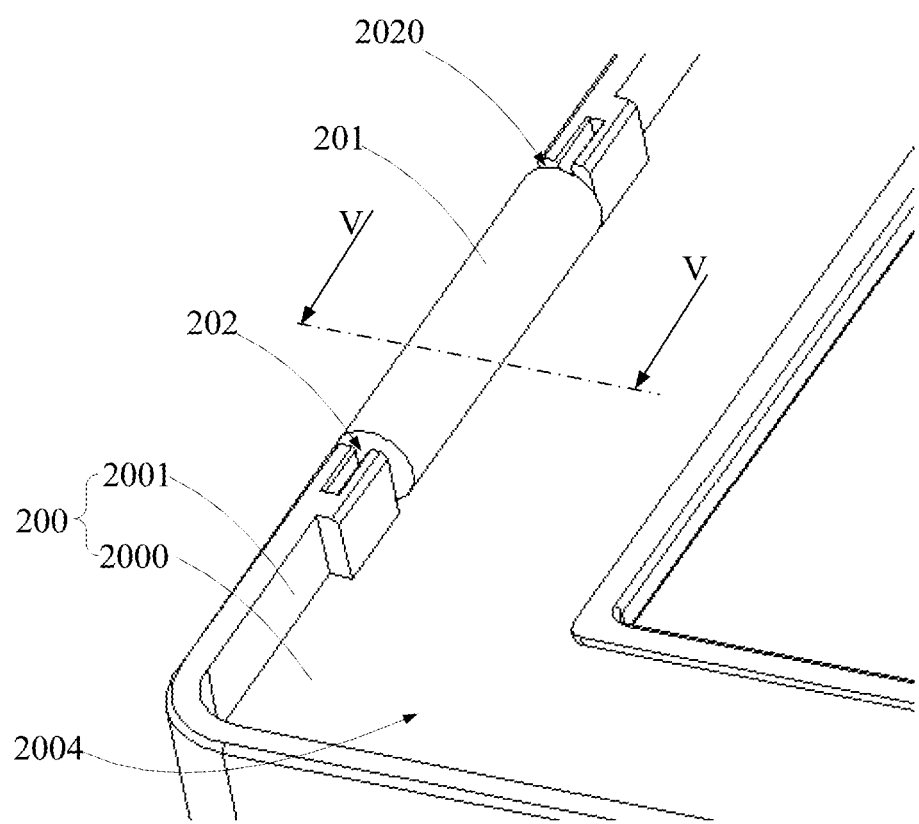
FIG. 4 is a schematic structural view of a frame in accordance with a second embodiment of the present invention.
Figure 5:
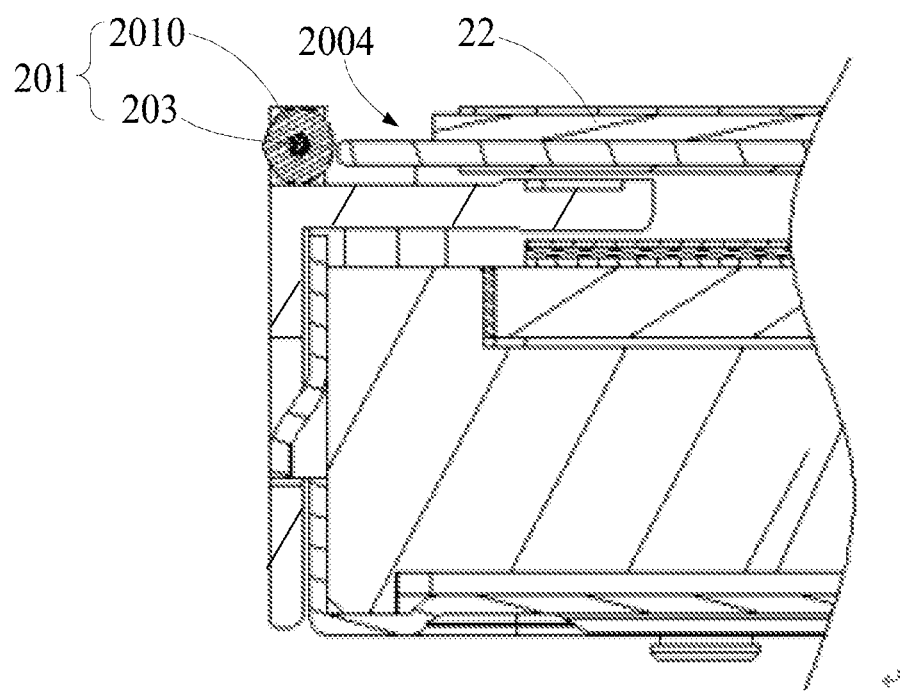
FIG. 5 is a cutaway view of FIG. 4 along V-V line.

Referring to FIGS. 4 and 5, a second embodiment of the present invention provides a display device 2. A structure of the display device 2 is similar to the structure of the display device 1. A difference between the display device 2 and the display device 1 is the cutout 202 only includes a third part 2020 defined in the first side wall 2001. The rotating part 201 includes an elongated circular roller 2010 and a rotating axis 203 passing through the roller 2010 along a rotational symmetry axis of the roller 2010. Two opposite ends of the rotating axis 203 along a longitudinal direction of the rotating axis 203 are correspondingly connected to two opposite end surfaces of the cutout 202 to assembly the roller 2010 in the cutout 202, and make the roller 2010 to rotate around the rotating axis 203 extending along the longitudinal direction of the side frame 200. The diameter of the roller 2010 is the same as a height of a portion of the second side wall 2001 extending from the holding board 2000.

When the display panel 22 is assembled, a periphery of the display panel 22 slides into the first receiving space 2004 from a top of the roller 2010 via a rotation of the roller 2010. When the display panel 22 needs to be taken out, to rotate the roller 2010 to bring the display panel 22 out of the first receiving space 2004 by a friction between the periphery of the display panel 22 and the outer surface of the roller 2010.

What is said above are only preferred examples of present invention, not intended to limit the present invention, any modifications, equivalent substitutions and improvements etc. made within the spirit and principle of the present invention, should be included in the protection range of the present invention.

What is claimed is:

1. A frame comprising:
a plurality of side frames connected end to end to form an enclosed frame for accommodating a display panel; and
at least one rotating part;
wherein the side frame defines at least one cutout extending along a longitudinal direction of the side frame, the rotating part is received in the cutout and is rotatably connected to the side frame via a rotating axis extending along the longitudinal direction of the side frame relative to the side frame, the display panel is assembled in the enclosed frame via the rotating part, wherein the side frame comprises a holding board and a first side wall, the holding board comprises a first surface and a second surface parallel arranged along a thickness direction thereof, the holding boards on a different side frame are connected end to end to form an enclosed frame with a central opening, the first side wall extends along the longitudinal direction of the side frame from a position on the first surface closing to an outer periphery of the first surface, the first side wall and the holding board cooperatively define a first receiving space to receive the display panel, wherein the frame further comprises a second side wall extending along the longitudinal direction of the side frame from a position on the second surface closing to an outer periphery of the second surface, the second side wall and the holding board cooperatively define a second receiving space, wherein the cutout comprises a first part defined in the first side wall and a second part defined in the holding board at a position corresponding to the first part, the first part completely cuts off the first side wall, the second part is extended along a width direction of the holding board, but do not cuts off the holding board.

2. The frame of claim 1, wherein the rotating part comprises a wall part corresponding to the first side wall and a holding part corresponding to the holding board, the wall part is connected to the holding part at a periphery extending along a longitudinal direction of the wall part, the wall part is received in the first part of the cutout, the holding part is received in the second part of the cutout, an outer side of the periphery at which the wall part is connected to the holding part is connected to a portion of the second side wall located in the cutout, a thickness of a connecting portion between the second side wall and the rotating part is distinctly less than a thickness of the second side wall.

3. The frame of claim 1, wherein the cutout comprises a third part defined in the first side wall, the rotating part comprises an elongated circular roller and a rotating axis passing through the roller along a rotational symmetry axis of the roller, two opposite ends of the rotating axis along a longitudinal direction of the rotating axis are correspondingly connected to two opposite end surfaces of the cutout to assembly the roller in the cutout, and make the roller to rotate around the rotating axis extending along the longitudinal direction of the side frame.

4. The frame of claim 1, wherein the cutouts are extended along the longitudinal direction of the side frame, a length of the cutout is less than a length of each side frame.

5. The frame of claim 1, wherein the number of the cutouts is two or more than two, the cutouts are symmetrical about a center of the enclosed frame.

6. A display device, comprising:
a frame; and
a display panel held in the frame;
wherein the frame comprises:
a plurality of side frames connected end to end to form an enclosed frame for accommodating a display panel; and
at least one rotating part;
the side frame defines at least one cutout extending along a longitudinal direction of the side frame, the rotating part is received in the cutout and is rotatably connected to the side frame via a rotating axis extending along the longitudinal direction of the side frame relative to the side frame, the display panel is assembled in the enclosed frame via the rotating part, wherein the side frame comprises a holding board and a first side wall, the holding board comprises a first surface and a second surface parallel arranged along a thickness direction thereof, the holding boards on a different side frame are connected end to end to form an enclosed frame with a central opening, the first side wall extends along the longitudinal direction of the side frame from a position on the first surface closing to an outer periphery of the first surface, the first side wall and the holding board cooperatively define a first receiving space to receive the display panel, wherein the frame further comprises a second side wall extending along the longitudinal direction of the side frame from a position on the second surface closing to an outer periphery of the second surface, the second side wall and the holding board cooperatively define a second receiving space, wherein the cutout comprises a first part defined in the first side wall and a second part defined in the holding board at a position corresponding to the first part, the first part completely cut off the first side wall, the second part is extended along a width direction of the holding board, but do not cuts off the holding board.

7. The display device of claim 6, wherein the display panel is selected from a group consisting of a liquid crystal display panel and an organic light emitting diode display panel.

8. The display panel of claim 6, wherein the rotating part comprises a wall part corresponding to the first side wall and a holding part corresponding to the holding board, the wall part is connected to the holding part at a periphery extending along a longitudinal direction of the wall part, the wall part is received in the first part of the cutout, the holding part is received in the second part of the cutout, an outer side of the periphery at which the wall part is connected to the holding part is connected to a portion of the second side wall located in the cutout, a thickness of a connecting portion between the second side wall and the rotating part is distinctly less than a thickness of the second side wall.

9. The display panel of claim 6, wherein the cutout comprises a third part defined in the tint side wall, the rotating part comprises an elongated circular roller and a rotating axis passing through the roller along a rotational symmetry axis of the roller, two opposite ends of the rotating axis along a longitudinal direction of the rotating axis are correspondingly connected to two opposite end surfaces of the cutout to assembly the roller in the cutout, and make the roller to rotate around the rotating axis extending along the longitudinal direction of the side frame.

10. The display panel of claim 6, wherein the cutouts are extended along the longitudinal direction of the side frame, a length of the cutout is less than a length of each side frame.

11. The display panel of claim 6, wherein the number of the cutouts is two or more than two, the cutouts are symmetrical about a center of the enclosed frame.

* * * * *